United States Patent
Kim et al.

(10) Patent No.: US 8,125,140 B2
(45) Date of Patent: Feb. 28, 2012

(54) ORGANIC LIGHT EMITTING DISPLAY WITH IMPROVED LIGHT EMITTING EFFICIENCY

(75) Inventors: Yong-Tak Kim, Suwon-si (KR); Jong-Hyuk Lee, Suwon-si (KR); Won-Jong Kim, Suwon-si (KR); Joon-Gu Lee, Suwon-si (KR); Jin-Baek Choi, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 207 days.

(21) Appl. No.: 12/544,210

(22) Filed: Aug. 19, 2009

(65) Prior Publication Data

US 2010/0045176 A1 Feb. 25, 2010

(30) Foreign Application Priority Data

Aug. 20, 2008 (KR) .................. 10-2008-0081363

(51) Int. Cl.
*H05B 33/00* (2006.01)
*H05B 33/26* (2006.01)
*H01J 1/62* (2006.01)
(52) U.S. Cl. ......... 313/504; 313/498; 428/690; 428/917
(58) Field of Classification Search ........... 313/504–506
See application file for complete search history.

(56) References Cited

U.S. PATENT DOCUMENTS

| | | | | |
|---|---|---|---|---|
| 5,969,474 A * | 10/1999 | Arai | ............... | 313/504 |
| 6,188,176 B1 * | 2/2001 | Nakaya et al. | ............... | 313/504 |
| 6,284,393 B1 * | 9/2001 | Hosokawa et al. | ........... | 428/690 |
| 7,429,822 B2 * | 9/2008 | Morita et al. | .................. | 313/504 |
| 2002/0187367 A1 | 12/2002 | Sakaguchi | | |
| 2007/0267973 A1 | 11/2007 | Suh | | |
| 2008/0254703 A1 * | 10/2008 | Kim et al. | ........................ | 445/24 |

FOREIGN PATENT DOCUMENTS

| | | |
|---|---|---|
| JP | 2005-310637 A | 11/2005 |
| JP | 2006-092867 A | 4/2006 |
| JP | 2008-108423 A | 5/2008 |
| KR | 10-2002-0093646 | 12/2002 |

(Continued)

OTHER PUBLICATIONS

KIPO Office action dated May 25, 2010, for priority Korean Patent application 10-2008-0081363.

(Continued)

*Primary Examiner* — Sikha Roy
(74) *Attorney, Agent, or Firm* — Christie, Parker & Hale, LLP (57) ABSTRACT

An organic light emitting display includes an anode; an organic layer on the anode; and a cathode on the organic layer. The cathode includes a first region and a second region which are sequentially disposed on the organic layer in parallel. The first and second regions are formed by doping a metal oxide on an indium oxide matrix. The doping density of the metal oxide of the first region is greater than that of the second region, the metal oxide of the first region has a density gradient, and the density of the metal oxide in a boundary surface of the first and second regions is the same. An organic light emitting display according to the present invention can increase light emitting efficiency without using a resonance structure.

12 Claims, 4 Drawing Sheets

FOREIGN PATENT DOCUMENTS

| | | |
|---|---|---|
| KR | 10-2005-0010332 | 1/2005 |
| KR | 10-2005-0012958 | 2/2005 |
| WO | WO 2006/082879 A1 | 8/2006 |

OTHER PUBLICATIONS

Japanese Patent Office Action dated May 24, 2011 in corresponding Japanese application No. 2009-199535, 3 shts.

Uchida, T. et al., "Ceseium-incorporated indium-tin-oxide films for use as a cathode with low work function for a transparent organic light-emitting device", Thin Solid Films 406 (2006), pp. 75-80, Elsevier.

Extended European Search Report dated Nov. 4, 2011 for EP Application 09252031.1, 9 pages.

* cited by examiner

ORGANIC LIGHT EMITTING DISPLAY WITH IMPROVED LIGHT EMITTING EFFICIENCY

CROSS-REFERENCE TO RELATED PATENT APPLICATION

This application claims priority to and the benefit of Korean Patent Application No. 10-2008-0081363, filed in the Korean Intellectual Property Office on Aug. 20, 2008, the entire content of which is incorporated herein by reference.

FIELD OF THE INVENTION

The present invention relates to an organic light emitting display having a top-emission structure with improved light emitting efficiency.

BACKGROUND OF THE INVENTION

Organic light emitting displays are self-emission devices. Organic light emitting displays have higher luminescence than liquid crystal displays, and are thinner than liquid crystal displays, as organic light emitting displays do not include a backlight unit.

An organic light emitting display has a structure wherein an anode, an organic layer, and a cathode are sequentially stacked on a substrate on which a pixel circuit, such as a thin film transistor, is deposited. The structure of an organic light emitting display can be a top-emission structure or a bottom-emission structure. In a top-emission structure, an image is realized toward the opposite direction of the deposited substrate, i.e., toward the cathode, and thus the aperture ratio of the top-emission structure is higher than that of the bottom-emission structure where an image is realized toward the substrate. Accordingly, the light emitting efficiency of a top-emission organic light emitting device is higher than a bottom-emission organic light emitting device. However in the top-emission structure, the cathode must be transparent, which is difficult. Generally, a basic requirement of the cathode is that the cathode must have a lower work function than the anode, but a material having a low work function is generally a metal that has low light transmittance.

A conventional transparent cathode is created by forming a thin metal layer having a low work function, but the light transmittance is still very low, and it is difficult to improve light transmittance.

Due to this limitation, a micro-cavity that amplifies light emitted from an emission layer has been suggested. However, the optimum thicknesses of micro-cavities are different for each color, and thus the thickness of the organic layer disposed between the anode and the cathode are different for each color. In other words, in an organic light emitting display, light is emitted as excitons are formed in the organic emission layer as electrons are injected into the holes of the anode from the cathode. In order to adjust the distance from the excitons and the resonance thickness, the thickness of the organic layer, specifically the thicknesses of the hole or electron injection layer, or the hole or electron transport layer, must be varied. Because the thickness of the organic layer must be different for each color, independent masks are used for each color. However, such an independent depositing method is complex, and thus the production costs increase.

Also, to increase the resolution of a display, masks must have a higher resolution pattern, which is difficult to obtain in a large area display.

Moreover, the thickness of the organic layer cannot be determined based only on the optical efficiency, because when the thickness of hole layers or electron layers are different, electrical characteristics of the organic light emitting display may deteriorate.

SUMMARY OF THE INVENTION

An embodiment of the present invention includes a top-emission type organic light emitting display comprising a cathode that is transparent and has a low work function, so as to increase the light emitting efficiency without employing a resonance structure in realizing an image toward the cathode.

In an embodiment of the present invention, an organic light emitting display includes: an anode; an organic layer on the anode, which includes an emission layer; and a cathode which is formed on the organic layer and transmits light emitted from the emission layer of the organic layer. The cathode includes a first region and a second region which are sequentially disposed on the organic layer in parallel. The first and second regions are formed by doping a metal oxide on an indium oxide matrix. The doping density of the metal oxide of the first region is greater than that of the second region, the metal oxide of the first region has a density gradient, and the density of the metal oxide in a boundary surface between the first and second regions is the same.

In embodiments of the present invention, a metal of the metal oxide may be Cs, Ca, Sr, Ba, Y, or a lanthanoid element.

In embodiments of the present invention, the doping density of the metal oxide may be a linear function with respect to a distance between the first region and the organic layer.

In embodiments of the present invention, the maximum value of the doping density of the metal oxide in the first region of the cathode may be from about 2% to about 10%.

In embodiments of the present invention the doping density of the metal oxide of the second region may be from about 0.0% to about 2.0%.

In embodiments of the present invention the average doping density of the metal oxide of the cathode may be from about 0.5% to about 12%.

In embodiments of the present invention, the thickness of the first region may be from about 5 nm to about 50 nm.

In embodiments of the present invention, the thickness of the second region may be from about 50 nm to about 200 nm.

In embodiments of the present invention, the thickness of the entire cathode may be from about 70 nm to about 200 nm.

In embodiments of the present invention, the work function of the first region may be between 3.6 eV and 4.7 eV.

In embodiments of the present invention, the resistivity of the second region may be from about 2.5 $\Omega$m to about 4.5 $\Omega$m.

In embodiments of the present invention, light transmittance of the cathode may be from about 80% to about 95%.

In embodiments of the present invention, a method of manufacturing an organic light emitting display includes: forming an anode; forming an organic layer including an emission layer on the anode; and forming a cathode on the organic layer, wherein the cathode is a transparent conductive layer. The cathode is comprised of a first region and a second region, sequentially formed on the organic layer in parallel. The cathode is formed by doping a metal or a metal oxide on an indium oxide by thermal depositing the metal or the metal oxide and the indium oxide while plasma is formed in a chamber. The first layer is formed by adjusting the doping amount of the metal or the metal oxide to decrease or increase according to a gradation deposition method, and a second region is formed on the first layer by fixing the doping amount of the metal or the metal oxide to be uniform.

In embodiments of the present invention, the metal may be Cs, Ca, Sr, Ba, Y, or a lanthanoid element.

In embodiments of the present invention, in forming the cathode, thermal deposition using metal and indium sources may be performed in an oxygen atmosphere.

In embodiments of the present invention, in forming the cathode, thermal deposition may be performed using metal and indium as sources in an atmosphere wherein oxygen and argon are mixed.

In embodiments of the present invention, the thermal deposition may be performed at a temperature equal to or below 100° C.

In embodiments of the present invention, in forming the cathode, the thermal deposition may be performed by ion beam assisted deposition.

In embodiments of the present invention, ions emitted from an ion beam source used in the ion beam assisted deposition may be ions of inert atoms.

In embodiments of the present invention, energy of the ion beam source used in the ion beam assisted deposition may be from about 50 eV to about 200 eV.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will be described more fully with reference to the accompanying drawings, in which exemplary embodiments of the invention are shown.

Figure 1:
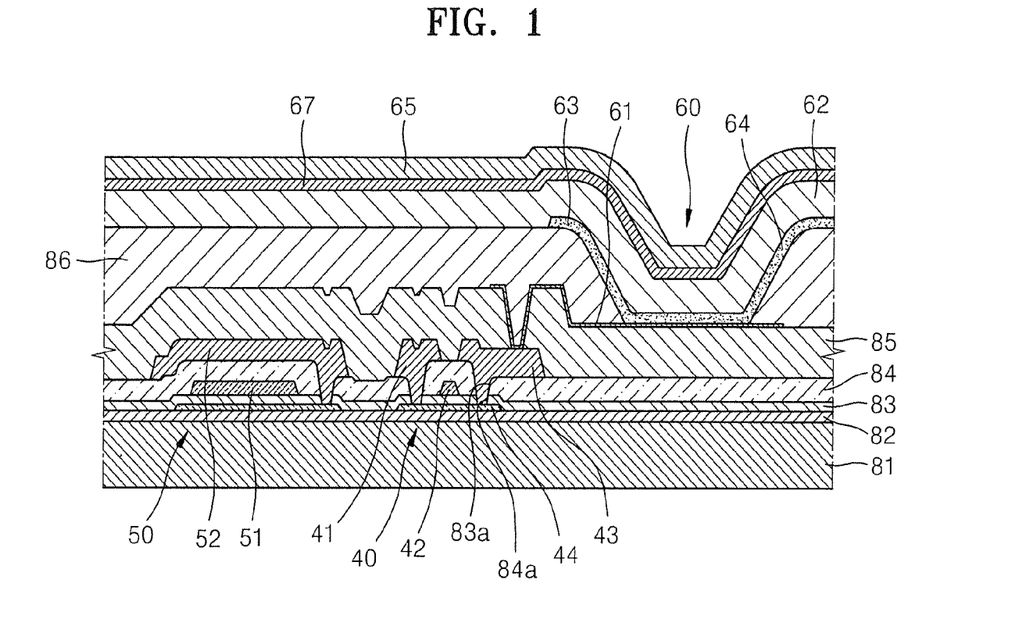
FIG. 1 is a cross-sectional view illustrating an active matrix type organic light emitting display according to an embodiment of the present invention.

FIG. 1 is a cross-sectional view illustrating an active matrix type organic light emitting display 60 according to an embodiment of the present invention, illustrating a capacitor 50 and a thin film transistor (TFT) 40.

Referring to FIG. 1, the organic light emitting display 60 includes a substrate 81. The substrate 81 may be formed of a transparent material, such as glass or plastic. A buffer layer 82 is formed on the substrate 81. The capacitor 50 includes a first capacitor electrode 51 and a second capacitor electrode 52 on the buffer layer 82.

An active layer 44 arranged in a pattern is formed on the top surface of the buffer layer 82. The active layer 44 is covered by a gate insulation layer 83. The active layer 44 may be a p-type or an n-type semiconductor.

A gate electrode 42 of the TFT 40 is formed on the top surface of the gate insulation layer 83 corresponding to the active layer 44. The gate electrode 42 is covered by an intermediate insulation layer 84. After the intermediate insulation layer 84 is formed, contact holes 83a and 84a are formed in the glass insulation layer 83 and the intermediate insulation layer 84 by etching the gate insulation layer 83 and the intermediate insulation layer 84 using an etching process such as dry etching, thereby exposing portions of the active layer 44.

The exposed portions of the active layer 44 are each connected to a source electrode 41 and a drain electrode 43 of the TFT 40, formed in the predetermined pattern, using the contact holes 83a and 84a. The source electrode 41 and the drain electrode 43 are covered by a protective layer 85. After the protective layer 85 is formed, a part of the drain electrode 43 is exposed using an etching process.

The protective layer 85 may be an insulator and formed of an inorganic material such as a silicon oxide or a silicon nitride, or an organic material such as acryl or benzocyclobutene (BCB). Also, a separate insulation layer (not shown) may be further formed on the protective layer 85 for planarizing the protective layer 85.

The organic light emitting display 60 displays an image by emitting red, green, and blue according to flow of the currents. The organic light emitting display includes an anode 61, which is a pixel electrode connected to the drain electrode 43 of the TFT 40, a cathode 62, which is a counter electrode covering entire pixels, and an organic layer 63, which is disposed between the anode 61 and the cathode 62 and includes an emission layer (not shown) emitting light. A pixel defining layer 86 covering the anode 61 includes a pixel opening 64 that exposes a portion of the anode 61.

The anode 61 and the cathode 62 are insulated from each other, and apply voltages of different polarities to the organic layer 63 to emit light.

The organic layer 63 may be formed of a low molecular organic material or a high molecular organic material. When a low molecular organic material is used, a hole injection layer (HIL), a hole transport layer (HTL), an emission layer (EML), an electron transport layer (ETL), and an electron injection layer (EIL) may be stacked in a single or complex structure. Examples of suitable low molecular organic materials include copper phthalocyanine (CuPc), N,N'-Di(naphthalene-1-yl)-N,N'-diphenyl-benzidine (NPB), and tris-8-hydroxyquinoline aluminum (Alq3). The organic layer comprising low molecular organic material may be formed using a vacuum deposition method.

When the high molecular organic material is used, an HTL and an EML may be stacked. The HTL may be comprised of Poly(3,4-ethylenedioxythiophene) (PEDOT) and the EML may be comprised of poly-phenylenevinylene (PPV) or polyfluorene high molecular organic material. The HTL and the EML may be formed using a screen printing or an inkjet printing method. However, the organic layer 63 is not limited to the above examples.

The anode 61 may be patterned to correspond to areas of each pixel, and the cathode 62 may cover all pixels.

The anode 61 may be transparent or reflective. When the anode 61 is transparent, the anode 61 may be formed of indium tin oxide (ITO), indium zinc oxide (IZO), zinc oxide (ZnO), or indium oxide ($In_2O_3$). When the anode 61 is reflective, a reflective layer may be formed using Ag, Mg, Al, Pt, Pd, Au, Ni, Nd, Ir, Cr, or mixtures thereof. A transparent electrode layer may then be formed on the reflective layer using ITO, IZO, ZnO, or $In_2O_3$.

The cathode 62 is formed to be transparent by doping a calcium oxide on an indium oxide matrix. The doping density of calcium in the cathode 62 may vary.

A material used to form a transparent cathode must have high transmittance in a visible ray area and a low work function for suitable electric conductivity for use as an electric material and convenient electron injection to an organic material. Generally, the transmittance of a visible ray from a metal to an insulator increases while electric conductivity from a metal to an insulator decreases. Mg/Ag, Al/Li, Yb/Ag, and Ca/Ag, which are well known cathode materials, have excellent electric characteristics and work function. However, when the thickness of a cathode made of these metals is equal to or above 10 nm, the transmittance is about 30%, and thus a light emitting efficiency of light emitted from an organic light is reduced. Furthermore, due to the use of a metal electrode, a resonance structure is generated, and thus the process is unstable, the driving voltage is increased, and the material cost is increased.

When metal is doped on a thin layer of ITO or ZnO to be used as a transparent electrode, the work function is equal to or higher than about 5.0 eV. Due to the high work function, such a transparent electrode may be unable to be used.

The cathode 62 according to an embodiment of the present invention is a transparent electrode including a metal oxide, and is formed in such a way that a doping density of the metal oxide has a density gradient so as to control the work function. In other words, the doping density of the metal oxide close to the organic layer 63 is higher so as to decrease the work function, and lower when the metal oxide is far from the organic layer 63 so that the cathode 62 becomes transparent.

The cathode 62 may be divided into two regions, i.e., a first region wherein the doping density of the metal oxide is higher near the oxide layer 63, and a second region wherein the doping density of the metal oxide is uniformly maintained but lower than that of the first region.

The metal oxide may be an oxide of Cs, Ca, Sr, Ba, Y, or a lanthanoid element. As used herein, lanthanoid elements are those elements having an atomic number of 57 to 71.

Figure 2:
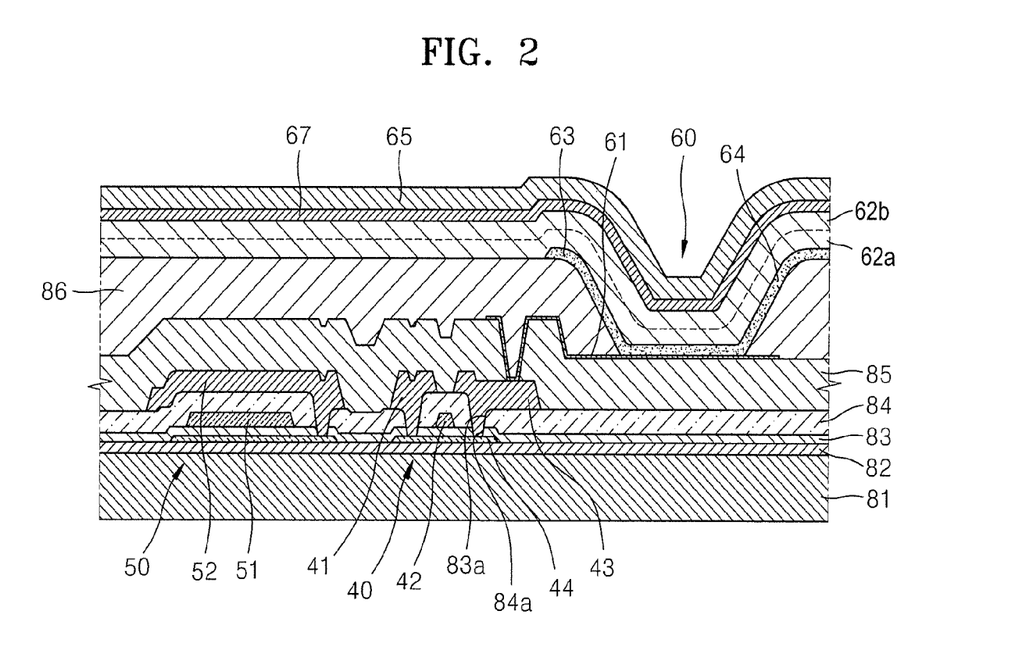
FIG. 2 is a cross-sectional view illustrating an active matrix type organic light emitting display according to another embodiment of the present invention.

In FIG. 2, the cathode 62 is divided into a first region 62a and a second region 62b. The doping density of the metal oxide on the boundary surface of the first and second regions 62a and 62b is the same. Furthermore, the first and second regions 62a and 62b are not formed as two separate layers, but are formed as a single layer having a density gradient.

The doping density of the metal oxide in the first region 62a decreases from the surface contacting the organic layer 63 towards the second region 62b. The doping density of the metal oxide of the first region 62a may decrease linearly with respect to the distance from the surface contacting the organic layer 63.

The doping density of the metal oxide in the first region 62a may be at a maximum in the surface contacting the organic layer 63. The maximum doping density of the first region may be from about 2% to about 10%. When the maximum doping density of the first region exceeds 10%, light transmittance may deteriorate, and when the maximum doping density of the first region is below 2%, the work function may deteriorate.

Meanwhile, the doping density of the metal oxide in the second region 62b may be the minimum value of the doping density of the metal oxide in the first region 62a. The doping density of the second region may be from about 0.0% to about 2.0%. When the doping density of the second region exceeds 2%, resistance may deteriorate.

The average doping density of the metal oxide in the cathode 62 may be between 0.5% and 12%. When the average doping density of the cathode exceeds 12%, the resistance may deteriorate, and when the average doping density of the cathode is below 0.5%, the work function may deteriorate.

The thickness of the first region 62a may be from about 5 nm to about 50 nm. When the thickness is below 5 nm, a low work function may not be obtained, and when the thickness exceeds 50 nm, a low resistance may not be obtained.

The thickness of the second region 62b may be from about 50 nm to about 200 nm. When the thickness is below 50 nm, a low resistance may not be obtained, and when the thickness exceeds 200 nm, a low work function may not be obtained.

The entire thickness of the cathode 62 may be from about 70 to about 200 nm. When the thickness is below 50 nm, a low resistance may not be obtained, and when the thickness exceeds 200 nm, a low work function may not be obtained.

According to an embodiment of the present invention, the work function of the first region 62a may be adjusted to be from about 3.6 eV to about 4.7 eV, by adjusting the doping densities of the metal oxides and thicknesses of the first and second regions 62a and 62b. The resistivity of the second region 62b may be from about 2.5 Ωm to about 4.5 Ωm. The light transmittance of the cathode 62 may be from about 80% to about 95%.

As described above, according to an embodiment of the present invention, the light transmittance of the cathode 62 is remarkably increased, and thus the light emitting efficiency may not be further improved by applying a resonance structure. Accordingly, the organic light emitting display 60 may use a non-resonance structure, thereby having an improved view angle characteristic and may also exclude an optical structure in the organic light emitting display 60.

An auxiliary electrode layer (not shown) or a bus electrode line (not shown) may be optionally formed on the cathode 62 by using ITO, IZO, ZnO, or $In_2O_3$. However, in an embodiment of the present invention, the cathode 62 comprises only a thin layer formed on the organic layer 63. One of ordinary skill in the art would know how to include an electrode layer or a bus electrode line in embodiments of the present invention.

A protective layer 65 may be further formed on the cathode 62. In other embodiments, a capping layer 67 may be between the protective layer 65 and the cathode 62.

An embodiment of the present invention provides a method of manufacturing an organic light emitting display, the method including forming an anode, forming an organic layer including an emission layer on the anode, and forming a cathode on the organic layer. To form the cathode, a transparent conductive layer, a metal or a metal oxide is doped on an indium oxide by thermal depositing the metal or the metal oxide and the indium oxide while plasma is formed in a chamber. A first layer of the cathode is formed by adjusting the doping amount of the metal or the metal oxide to decrease or increase according to a gradation deposition method, and then a second region of the cathode is formed by fixing the doping amount of the metal or the metal oxide to be uniform. The first and second regions are sequentially formed on the organic layer in parallel.

An organic light emitting display 60 may be manufactured according to the above method.

In an embodiment of the present invention the anode may be formed using various methods such as a deposition method or a sputtering method. In other words, referring to FIGS. 1 and 2, the organic layer 63 is not yet formed when the anode 61 is formed, and thus the anode 61 may be formed using any method.

The organic layer 63 may be formed on the anode 61 using a vacuum deposition method or the like.

The cathode 62 is formed on the organic layer 63 as a transparent conductive layer. The cathode 62 is a transparent conductive layer wherein a metal oxide is doped on an indium oxide. Conventionally, the cathode 62 is formed using a sputtering method. However, if a cathode is formed using a sputtering method in embodiments of the present invention, the organic layer 63 is damaged due to characteristics of the sputtering method. When a cathode 62 is formed using a thermal deposition method in embodiments of the present invention, the organic layer 63 is damaged due to high temperature during thermal deposition. However, according to embodiments of the present invention, the cathode 62 is formed using low temperature thermal deposition, and thus the organic layer 63 is not damaged. Accordingly, an organic light emitting display 60 having high quality is manufactured.

When the cathode 62 is formed using the thermal deposition method, the temperature of the substrate 81 on which the organic light emitting display 60 is to be formed reaches about 300° C., and thus the organic layer 63, as an intermediate layer, is damaged by the high temperature. According to embodiments of the present invention, a metal oxide and an indium oxide are thermal deposited while plasma is formed in a chamber, remarkably reducing the temperature of the substrate 81. In other words, the cathode 62 is formed while plasma is formed in the chamber, ionizing a material of the cathode 62, so that deposition is formed without increasing the deposition temperature. As such, when the cathode 62 is thermal deposited while plasma is formed in the chamber, the temperature of the substrate 81 only increases up to 100° C., and thus the organic layer 63 is not damaged. Also, when the cathode 62 is thermal deposited while plasma is formed in the chamber, the temperature of the substrate 81 is reduced, and mobility of the cathode 62 is improved, and thus resistance of the cathode 62 is remarkably reduced.

As described above, the organic layer 63 disposed between the anode 61 and the cathode 62 includes not only the emission layer but also other various layers such as an EIL, an ETL, an HIL, and an HTL. The other various layers are formed of materials having a suitable lowest unoccupied molecular orbital (LUMO) level, in consideration of the work functions of the anode 61 and the cathode 62. Accordingly, in order to use conventional materials for an organic layer, the work function of the cathode of an organic light emitting display manufactured using the method of an embodiment of the present invention may have a similar work function as a transparent cathode manufactured using a conventional sputtering method.

In an embodiment of the present invention, an indium oxide is thermal deposited simultaneously with a metal or a metal oxide, instead of thermal depositing only an indium oxide while forming the cathode 62. The cathode 62 is divided into two regions having different doping densities of a metal oxide.

Figure 3:
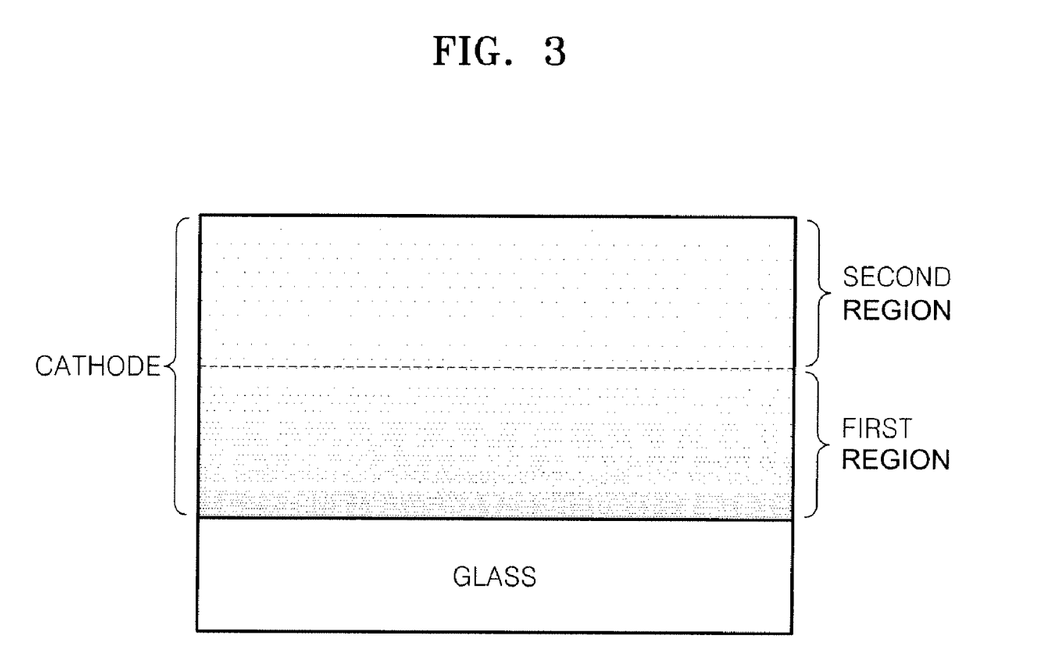
FIG. 3 is a diagram illustrating a cathode manufactured on a glass substrate according to an embodiment of the present invention.

FIG. 3 is a diagram illustrating a cathode manufactured on a glass substrate according to an embodiment of the present invention. In FIG. 3, the cathode is formed in a single layer, but the density of a metal in the cathode may be controlled as the cathode is formed using a gradation deposition method. The gradation deposition method may be, for example, a method of changing a deposition rate of a metal while fixing a deposition rate of an indium oxide.

FIG. 3 illustrates the cathode deposited on glass in a single layer form. A first region directly on the glass is deposited by decreasing a deposition rate of a metal in the gradation deposition method. Then, a second region is deposited while uniformly maintaining a low deposition rate of the metal so as to support a high resistance in the first region.

The glass of FIG. 3 is for illustration and testing purposes only, as in embodiments of the present invention, the cathode is formed on the organic layer 63 of FIG. 1 or 2.

In embodiments of the present invention, a metal or a metal oxide and an indium oxide are simultaneously thermal deposited to form the cathode. The metal may be Cs, Ca, Sr, Ba, Y, or a lanthanoid element. The metal oxide may be cesium oxide, calcium oxide, strontium oxide, barium oxide, yttrium oxide, or oxides of a lanthanoid element. An absolute value of the work function of the metal or the metal oxide is lower than an absolute value of the work function of the indium oxide.

A method of forming such a cathode, i.e. a method of forming a transparent conductive layer wherein the metal oxide is doped on the indium oxide, may vary. For example, thermal deposition may be performed in an oxygen atmosphere or an oxygen and argon mixed atmosphere, having metal and indium as sources. In this case, due to the oxygen atmosphere, the indium turns into an indium oxide and the metal turns into a metal oxide, and thus, as a result, the cathode, wherein the metal oxide is doped on the indium oxide, is formed. Alternatively, the thermal deposition may be performed in an oxygen atmosphere or an oxygen and argon mixed atmosphere having a metal and an indium oxide as sources. In this case, the metal turns into a metal oxide in the oxygen atmosphere, and thus the cathode, wherein the metal oxide is doped on the indium oxide, is formed. Alternatively, the thermal deposition may be performed in an argon atmosphere having a metal oxide and an indium oxide as sources, thereby forming the cathode wherein the metal oxide is doped on the indium oxide. In this case, since argon is an inactive gas, argon does not affect the metal oxide or the indium oxide.

Figure 4:
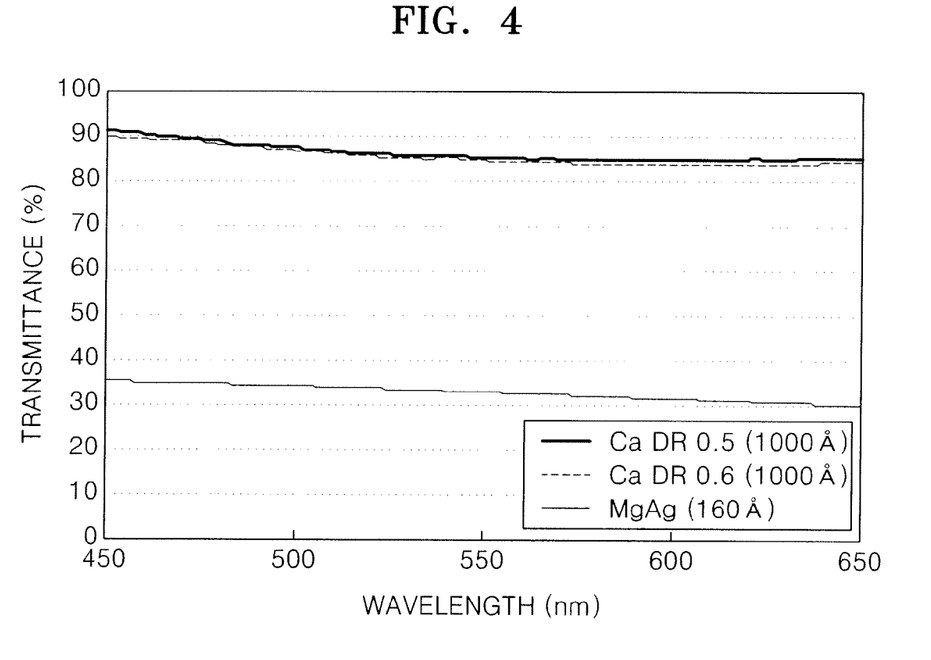
FIG. 4 is a graph comparing light transmittances of cathodes according to embodiments of the present invention and the light transmittance of a conventional cathode.

FIG. 4 is a graph comparing light transmittances of cathodes formed using a method according to embodiments of the present invention and a conventional cathode. Cathodes formed by using a method according to embodiments of the present invention have a thickness of 1000 Å and, for testing purposes, are formed by depositing calcium as a metal on a glass at deposition rates of 0.5 Å/s and 0.6 Å/s. The calcium is doped in a form of a calcium oxide after being combined to oxygen, and thus the transmittance of the calcium is similar to transmittance of indium oxide. Accordingly, transmittance is similar regardless of the doping amount of calcium. Meanwhile, the conventional cathode has a thickness of 160 Å and is formed by co-depositing Mg and Ag. Referring to FIG. 4, the transmittance of a conventional cathode is about 33%, whereas the transmittances of the cathodes formed by using a method according to embodiments of the present invention are equal to or higher than about 85%. Accordingly, it can be seen that the transmittances of cathodes formed by using the methods of embodiments of the present invention are improved compared to the transmittance of conventional cathodes.

Figure 5:
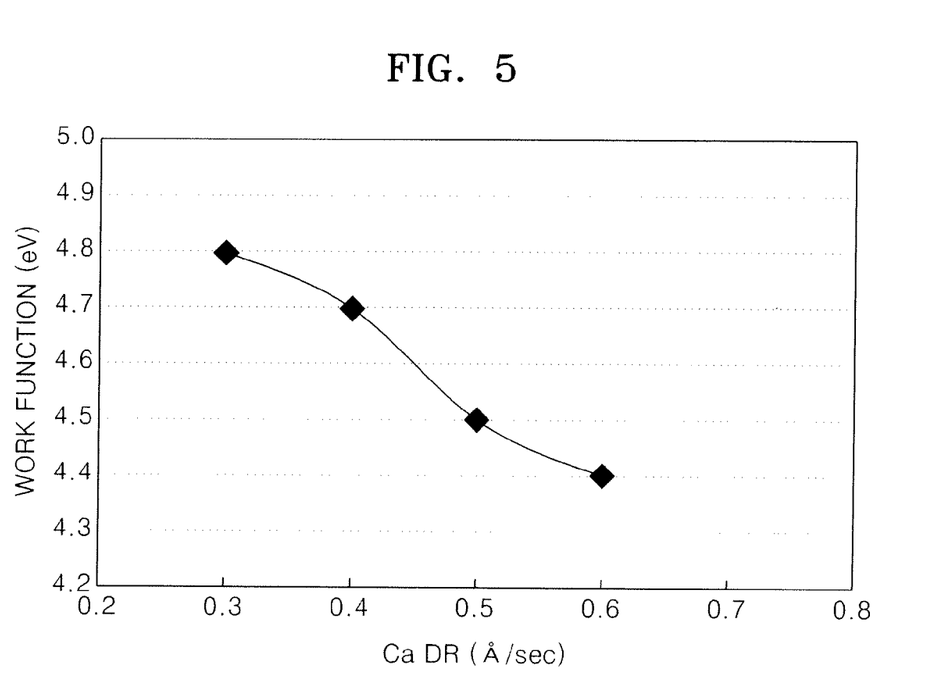
FIG. 5 is a graph of work function according to a calcium deposition rate (Ca DR) when manufacturing a calcium doped cathode according to embodiments of the present invention.

FIG. 5 is a graph of a work function according to a calcium deposition rate (Ca DR), when calcium is used as a metal in the first region of FIG. 3. When CaO is formed, as the calcium is combined to oxygen, work function decreases. According to V. S. Fomenko, Handbook of Thermoionic Properties, Plenum Press Data Division (New York, 1966), work functions of Cs, Sr, Ba, Y, and lanthanoid elements, like the work function of Ca, decrease when oxidized. Work functions of pure metals do not decrease when pure metals are oxidized. As shown in FIG. 5, as the amount of CaO increases, the work function decreases. For example, when the Ca DR is 0.6, the work function is 4.4 eV.

As the Ca DR is high during initial deposition, a work function on the interface between the glass of FIG. 3 and a deposited thin layer cathode may be lower than the work function of the deposited thin layer cathode as a whole. The resistivity at the interface between the glass of FIG. 3 and the deposited thin layer cathode is 3~20×10$^{-4}$ Ωm.

The cathode 62 of FIG. 1 or the first or second region 62a or 62b of FIG. 2 may be formed by ion beam assisted deposition (IBAD) using an evaporation source and an ion beam source.

Figure 6:
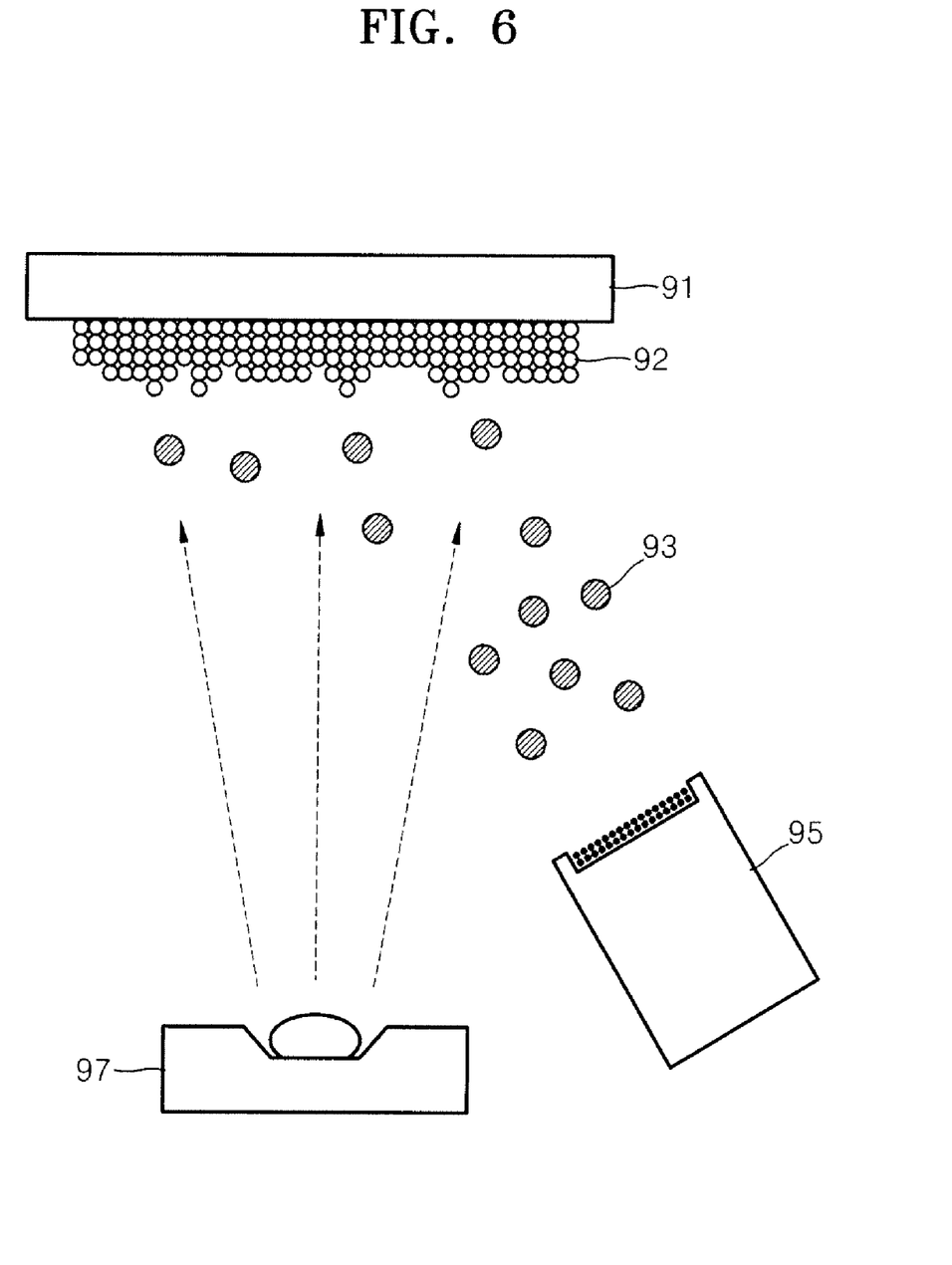
FIG. 6 is a diagram schematically illustrating principles of ion beam assisted deposition (IBAD).

FIG. 6 is a diagram schematically illustrating IBAD. Referring to FIG. 6, particles 92 are discharged from an evaporation source 97, and are deposited on one surface of a substrate 91. Meanwhile, ions 93 are discharged from an ion beam source 95, increasing the surface mobility of the particles 92, and thus the particles 92 are densely deposited on the substrate 91.

According to a method of manufacturing an organic light emitting display according to an embodiment of the present invention, a cathode may be formed by using IBAD.

Specifically, when the second region 62b of FIG. 2 is formed by using IBAD, the first region 62a may be formed first by using a conventional deposition method, such as a vacuum deposition method or a thermal deposition method. Then, the second region 62b may be formed by using IBAD on the first region 62a. In this case, the first and second regions 62a and 62b of the cathode 62 are formed of the same material, but since the first and second regions 62a and 62b are formed using different methods, atom arrangement structures of the first and second regions 62a and 62b are different.

The particles 92 discharged from the evaporation source 97 during IBAD are materials for forming the cathode 62, and may be indium, an indium oxide, a metal, or a metal oxide, as described above.

Meanwhile, the ions 93 discharged from the ion beam source 95 generally do not react with the substrate on which the cathode 62 is formed, the organic layer 63, or the particles 92 discharged from the evaporation source 91. The ions 93 may be ions of an inert atom, for example, $Ar^+$, $Kr^+$, or $Xe^+$ ions.

Energy of the ion beam source 95 ranges between 50 eV and 200 eV, and may range between 80 eV and 150 eV. When the energy is below 50 eV, the surface mobility of the particles 92 cannot be increased as the energy of the ions 93 too low, and thus the cathode 62 having a high density and low surface illuminance may not be formed. When the energy exceeds 200 eV, the cathode 62 may be etched since the energy of the ions 93 is too high. In some embodiments of the invention, the energy may be 150 eV.

In using IBAD, the ratio of the number of particles 92 discharged from the evaporation source 97 to the number of ions 93 discharged from the ion beam source 95 may range between 1:1 and 0.9:1 (particles:ions). In some embodiments of the present invention, the ratio of particles 92 discharged from the evaporation source 97 to the number of ions 93 discharged from the ion beam source 95 may be 0.9:1. When the number of ions 93 exceeds the 0.9:1 ratio, the cathode 62 may be etched by the ions 93. When the number of ions 93 is below the 1:1 ratio, the surface mobility of the particles 92 may not be increased by the ions 93, and thus the cathode 62 having a compact structure in a high density and a low surface illuminance may not be formed.

The ratio of particles to ions may be varied by controlling the electron flow rate of the ion beam source 95 or the inflow rate of ion generating gas. For example, when an Al cathode is formed by using an evaporation source discharging Al particles and an ion beam source discharging argon ions, the ion flow rate of the ion beam source can be adjusted to 50 mA and the inflow rate of argon gas can be adjusted to 5 sccm. In such a cathode, the ratio of Al particles to argon ions is 1:1.

In using IBAD, a thermal evaporation source or an electro evaporation source is used as the evaporation source 97. The ion beam source 95 may be a Kaufmann type ion gun, an End-Hall type ion gun, or an RF type ion gun. One of ordinary skill in the art may select any evaporation source 97 and ion beam source 95 that is suitable for IBAD.

The organic light emitting display of the present invention is an active matrix organic light emitting display, but the present invention is not limited thereto.

The present invention will now be described in further detail with reference to the following examples.

EXAMPLE 1

An organic light emitting display having an anode/organic layer/cathode structure was formed on a TFT as described above. In Example 1, the cathode was formed using IBAD. The ion beam used in the IBAD had a voltage of between 50 V and 200 V, and a current of between 0.05 A and 0.2 A.

A glass substrate, wherein 1500 Å of ITO, 400 Å of 4,4'-bis(N-(4-(N-(3-methylphenyl)-N-phenylamino)phenyl)-N-phenylamino)biphenyl (DNTPD), 150 Å of NPB, 300 Å of distyrylanthracene (DSA)+5% distyrylanthraceneamine (DSAamine), 100 Å of bis(10-hydroxybenzo[h]quinolinato beryllium (Bebq2), and 10 of Å LiF were sequentially stacked on the substrate. A first layer of a cathode was formed having a thickness between 20 nm and 30 nm, by depositing calcium at an initial deposition rate of 0.7 Å/s, until the deposition rate decreased to 0.2 Å/s. Then, a second region of the cathode was formed having a thickness between 60 nm and 100 nm, by maintaining the deposition rate of calcium between 0.0 Å/s and 0.2 Å/s. An Al deposition source was prepared by using an Al wire having a diameter of 3π. Next, a container including the Al deposition source, an ion beam source, a thermal evaporation source, a substrate holder, and a rotation shaft that rotates the substrate holder was prepared. An End-Hall type ion gun (manufactured by Infovion, Inc., Korea) was used as the ion beam source, and a Helisys (manufactured by ANS, Inc., Korea) was used as the thermal evaporation source. After mounting the substrate on the substrate holder that faces the Al deposition source, the container was operated so as to form an Al layer having a thickness of 2000 Å on the substrate under the conditions shown in Table 1 below.

TABLE 1

| | |
|---|---|
| Basic Pressure | 1.0 × 10$^{-7}$ Torr |
| Gas Flow Rate | Oxygen Flow Rate: ~2 sccm |
| | Argon Flow Rate: ~10 sccm |
| Thermal Evaporation Source | Tungsten Boat, BN Boat |
| Thermal Evaporation Source Operation Condition | 200 A |
| Ion Beam Source | End-Hall Type Ion Gun |
| Ion Beam Source Operation Condition | Discharge Current: ~500 mA |
| | Discharge Voltage: ~300 V |
| | Beam Voltage: ~150 eV |
| | Beam Current: ~50 mA |
| Depositon Angle | 90° |
| Substrate RPM | 4.5 |
| Substrate Temperature | 80° C. |
| Deposition Rate | 5 Å/sec |

An organic light emitting display including the Al layer formed in Example 1 is referred to as Sample 1.

COMPARATIVE EXAMPLE 1

An organic light emitting display, wherein 1500 Å of ITO, 400 Å of DNTPD, 150 Å of NPB, 300 Å of DSA+5% DSAamine, 100 Å of Bebq2, 10 Å of LiF, and 1500 Å of Al were sequentially stacked on a glass substrate in the same manner as in Example 1. The organic light emitting display made according to Comparative Example 1 is referred to as Comparative Sample 1

EVALUATION

Current-voltage characteristics of Sample 1 and Comparative Sample 1 were evaluated by using a Keithley 238 source-measure unit (manufactured by Keithley Instruments, Inc.; Cleveland, Ohio). Sample 1 had an excellent current density characteristic and an excellent efficiency characteristic compared to Comparative Sample 1.

The current efficiency of Sample 1 was measured, and a current efficiency of 5 cd/A was detected at 5 V, which demonstrates that Sample 1 has excellent electric characteristics.

As described above, an organic light emitting display having a top-emission structure can have an increased light coupling efficiency without employing a micro-cavity structure. Additionally, an organic light emitting display having a top-emission structure can have a decreased driving voltage.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light emitting display comprising:
an anode;
an organic layer on the anode comprising an emission layer; and
a cathode on the organic layer, wherein the cathode comprises a first region adjacent to the organic layer and a second region adjacent to the first region, the first and second regions comprising an indium oxide matrix doped with a metal oxide wherein:
a doping density of the metal oxide of the first region is greater than a doping density of the metal oxide of the second region;
the doping density of the metal oxide of the first region has a doping density gradient;
the doping density of the metal oxide of the second region is uniform; and
the doping densities of the metal oxide at a boundary surface between the first region and the second region are the same.

2. The organic light emitting display of claim 1, wherein a metal of the metal oxide is selected from the group consisting of Cs, Ca, Sr, Ba, Y, and lanthanoid elements.

3. The organic light emitting display of claim 1, wherein the doping density gradient of the metal oxide of the first region has a linear relationship with respect to a distance from the organic layer.

4. The organic light emitting display of claim 1, wherein the maximum value of the doping density of the metal oxide in the first region of the cathode is from about 2% to about 10%.

5. The organic light emitting display of claim 1, wherein the doping density of the metal oxide of the second region is less than about 2.0%.

6. The organic light emitting display of claim 1, wherein the average doping density of metal oxide of the cathode is from about 0.5% to about 12%.

7. The organic light emitting display of claim 1, wherein the thickness of the first region is from about 5 nm to about 50 nm.

8. The organic light emitting display of claim 1, wherein the thickness of the second region is from about 50 nm to about 200 nm.

9. The organic light emitting display of claim 1, wherein the thickness of the cathode is from about 70 nm to about 200 nm.

10. The organic light emitting display of claim 1, wherein a work function of the first region is between about 3.6 eV and about 4.7 eV.

11. The organic light emitting display of claim 1, wherein a resistivity of the second region is from about 2.5 $\Omega$m to about 4.5 $\Omega$m.

12. The organic light emitting display of claim 1, wherein light transmittance of the cathode is from about 80% to about 95%.

* * * * *